United States Patent
Kim et al.

(10) Patent No.: US 10,777,484 B2
(45) Date of Patent: Sep. 15, 2020

(54) HEAT SINK PLATE

(71) Applicant: THE GOODSYSTEM CORP., Ansan-si, Gyeonggi-do (KR)

(72) Inventors: Il-ho Kim, Yongin-si (KR); Meoung-whan Cho, Yongin-si (KR); Young-suk Kim, Suwon-si (KR)

(73) Assignee: THE GOODSYSTEM CORP., Ansan-si, Gyeonggi-do (KR)

( * ) Notice: Subject to any disclaimer, the term of this patent is extended or adjusted under 35 U.S.C. 154(b) by 125 days.

(21) Appl. No.: 16/157,110

(22) Filed: Oct. 11, 2018

(65) Prior Publication Data
US 2019/0115279 A1  Apr. 18, 2019

(30) Foreign Application Priority Data

Oct. 12, 2017 (KR) .......................... 10-2017-0132188
Dec. 19, 2017 (KR) .......................... 10-2017-0174778

(51) Int. Cl.
| | |
|---|---|
| *B32B 15/20* | (2006.01) |
| *H01L 23/373* | (2006.01) |
| *B32B 3/26* | (2006.01) |
| *B32B 15/04* | (2006.01) |
| *C22C 9/00* | (2006.01) |
| *C22C 27/04* | (2006.01) |
| *F28F 21/08* | (2006.01) |

(52) U.S. Cl.
CPC .......... *H01L 23/3735* (2013.01); *B32B 3/26* (2013.01); *B32B 15/043* (2013.01); *B32B 15/20* (2013.01); *C22C 9/00* (2013.01); *C22C 27/04* (2013.01); *F28F 21/085* (2013.01); *H01L 23/373* (2013.01); *B32B 2250/03* (2013.01); *B32B 2250/40* (2013.01); *B32B 2264/108* (2013.01); *B32B 2307/302* (2013.01); *F28F 2255/06* (2013.01); *Y10T 428/1291* (2015.01); *Y10T 428/12806* (2015.01); *Y10T 428/12903* (2015.01)

(58) Field of Classification Search
None
See application file for complete search history.

(56) References Cited

U.S. PATENT DOCUMENTS

2009/0208722 A1* 8/2009 Timmerman ............. B32B 5/12
428/221

FOREIGN PATENT DOCUMENTS

WO    WO94/14200   *  6/1994  ............ H01L 35/16

* cited by examiner

*Primary Examiner* — Seth Dumbris
(74) *Attorney, Agent, or Firm* — Revolution IP, PLLC

(57) ABSTRACT

A heat sink plate having a structure in which two or more kinds of materials are laminated, includes: a core layer in the thickness direction of the heat sink plate; and cover layers covering a top surface and a bottom surface of the core layer; wherein the cover layers comprise a material containing copper, wherein the core layer is formed of a matrix having a first thermal expansion coefficient and a plurality of layers extending in parallel along the thickness direction of the core layer in a lattice form in the matrix, wherein the plurality of layers are made of an alloy having a second thermal expansion coefficient.

8 Claims, 9 Drawing Sheets

HEAT SINK PLATE

BACKGROUND OF THE INVENTION

1. Field of the Invention

The present invention relates to a heat sink plate, and more particularly, to a heat sink plate which can be suitably used for packaging a high-output semiconductor device using a compound semiconductor, wherein the heat sink plate has the same or a similar thermal expansion coefficient to a ceramic material so as to allow good bonding even when bonded to a ceramic material such as alumina ($Al_2O_3$), and at the same time, is capable of rapidly discharging a large amount of heat, which is generated in the high-output device to the outside, thereby obtaining a high thermal conductivity.

2. Description of the Related Art

In recent years, high-output amplification devices using GaN type compound semiconductors have attracted attention as core technology in information and communication and defense fields.

In such high-output electronic or optical devices, a large amount of heat is generated compared to general devices, and therefore packaging technology, which is capable of efficiently discharging a large amount of generated heat, is needed.

Currently, high-output semiconductor devices utilizing GaN type compound semiconductors use metallic composite plates having comparatively good thermal conductivities and low thermal expansion coefficients, such as a two-layer composite material of W/Cu, a two-phase composite material of Cu and Mo, a three-layer composite material of Cu/Cu—Mo alloy/Cu, and a multi-layer composite material of Cu/Mo/Cu/Mo/Cu.

However, since the thermal conductivities of the composite plates, in the thickness direction, are about 250 W/mK at maximum and actually a thermal conductivity higher than 250 W/mK cannot be achieved, it is difficult to apply these composite plates to devices such as power transistors having hundreds watt properties.

On the other hand, a brazing process with a ceramic material such as alumina ($Al_2O_3$) is essential for a process of manufacturing semiconductor devices.

Since the brazing process is performed at a high temperature of 800° C. or higher, bending or breakage occurs in the brazing process due to the differences in thermal expansion coefficient between the metallic composite plate and the ceramic material, and such bending or breakage may be the cause of defective devices.

Furthermore, in recent years, in order to achieve high-output and improve production efficiency when manufactured, a plurality of chips is mounted on one heat sink plate, and thus, a length of the package is getting longer. As the length of the package becomes longer, the length of the heat sink plate also becomes longer, which causes the defective devices when the number of semiconductor devices mounted with the differences in thermal expansion coefficient between the heat sink plate and the semiconductor devices, which does not cause defectiveness when mounting one chip, increases. Therefore, in the case of the heat sink plate used for mounting several chips, the thermal expansion coefficient similarity to the ceramic material is more important subject, and thus, it is urgent to develop a heat sink plate having a similar thermal expansion coefficient to the ceramic material and a good heat radiation characteristic.

SUMMARY OF THE INVENTION

The purpose of the invention, in order to overcome the described limitations of the related art, is to provide a heat sink plate having a low thermal expansion coefficient of $9.0 \times 10^{-6}$/K or less in a plane direction (transverse and/or longitudinal direction) of the plate, in which bending or breakage does not occur when bonded to a ceramic material (in particular, alumina), and in addition, a high thermal conductivity of 350 W/mK or more in a thickness direction of the plate can be achieved, and thus the heat sink plate may be particularly suitably used for mounting several chips of high-output devices such as several hundred watts power transistors.

The invention, in order to overcome the described limitations, provides a heat sink plate having a structure in which two or more kinds of materials are laminated, comprising a core layer in the thickness direction of the heat sink plate and cover layers covering a top surface and a bottom surface of the core layer, wherein the cover layers comprise a material containing copper, wherein the core layer is formed of a matrix having a first thermal expansion coefficient and a plurality of layers extending in parallel along the thickness direction of the core layer in a lattice form in the matrix, wherein the plurality of layers are made of an alloy having a second thermal expansion coefficient.

The heat sink plate, according to the invention, can be suitably used for high-output devices because the thermal conductivity of the plate is 350 W/mK or more in the thickness direction, in particular, 400 W/mK or more according to the preferred embodiment.

Furthermore, according to the invention, since the heat sink plate having the thermal expansion coefficient of $8.0 \times 10^{-6}$/K to $9.0 \times 10^{-6}$/K in the plane direction (transverse or longitudinal direction) does not have a large difference in the thermal expansion coefficient from high-output devices formed of the ceramic material brazed to the heat sink plate, bending, delamination, or breakage of the ceramic in the brazing process for packaging two and more devices can be prevented.

DETAILED DESCRIPTION OF THE EXEMPLARY EMBODIMENTS

Hereinafter, preferred embodiments of the invention will be described in detail with reference to the accompanying drawings. However, the following embodiments of the invention may be modified in various forms, and the scope of the invention is not limited to the embodiments described below. The embodiments of the invention are provided so that the disclosure of the present invention is delivered more fully to those skilled in the art.

The present inventors have conducted a study to achieve a heat sink plate having not only low thermal expansion coefficients of $9.0 \times 10^6$/K or less in the plane direction of the plate (length and width directions of the plate), but high thermal conductivities of 350 W/mK or more in the thickness direction of the plate, and as a result, have found that the thermal expansion coefficients in the longitudinal direction and the thermal conductivities in the thickness direction of the heat sink plate, as described above, can be achieved through the heat sink plate having the following structure, leading to the invention.

Figure 1:
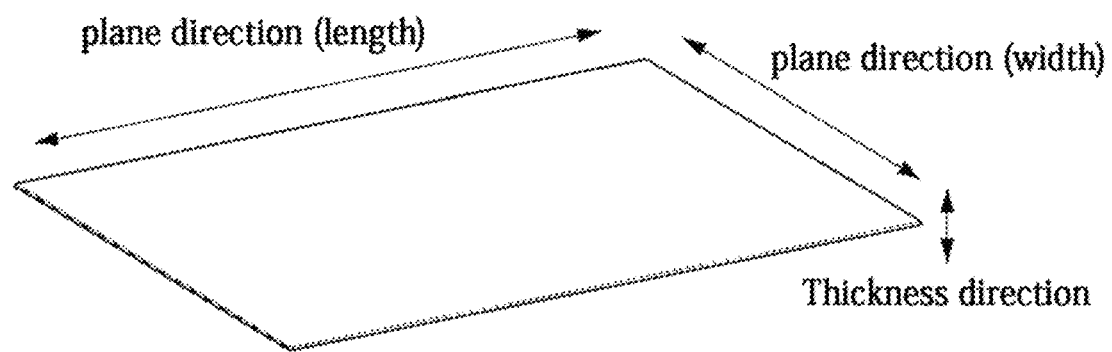
FIG. 1 illustrates a structure of a heat sink plate according to the invention, and a thickness direction and a plane (length and width) direction defined in the invention.

FIG. 1 illustrates a structure of a heat sink plate according to the invention, and a thickness direction and a plane (length and width) direction defined in the invention. The length direction means relatively longer longitudinal direction and the width direction means a direction perpendicular to the length direction, and when the lengths in the longitudinal and width directions are the same, one of the two directions is set as the length direction and another direction is set as the width direction.

The heat sink plat according to the invention is characterized by having a structure in which two or more kinds of materials are laminated, and including a core layer in the thickness direction and cover layers covering a top surface and a bottom surface of the core layer, wherein the cover layers are formed of a material containing copper, the core layer includes a matrix which has a composite structure of a material containing copper and carbon, and an alloy layer containing Cu, Mo or Cu and Mo and arranged in a lattice form in the matrix.

As described, in the invention, the cover layers use the material containing copper as a main component, and the core layer uses the composite structure containing copper and carbon. Also, by disposing the alloy layer containing Cu, Mo, or Cu and Mo arranged in a lattice form in the composite structure, the delamination resistance between the cover layers and the core layer can be enhanced, and at the same time, the thermal expansion coefficient in the plane direction (length and width direction) may be adjusted to be similar to that of the ceramic material with the high thermal conductivity which cannot be achieved in existing general heat sink plates, in the thickness direction. In addition, the materials and structure of the heat sink plate, according to the invention, can minimize the difference in the thermal deformation even when two or more devices are bonded to the heat sink plate, thereby preventing delamination or breakage of the ceramic.

Furthermore, in the heat sink plate, the composite structure is composed of copper and plate-shaped carbon particles, and the plate-shaped carbon particles are oriented in parallel to the thickness direction, and at the same time, the plate-shaped particles may be oriented parallel to one direction (that is, the longitudinal direction or the width direction) of the plane directions perpendicular to the thickness direction of the heat sink plate. The shape of the plate-shaped carbon particles means that it includes not only a plate-like shape but a powder of a flake or scale form.

Further, in the invention, 'the structure oriented parallel to the thickness direction or one direction of the plane directions' means a structure in which plate-shaped particles having the internal angles of less than 45° with the direction exceed 50% by area fraction of the composite structure, and it is preferred that the particles having the internal angles of less than 45° with the direction have 70% or more by area fraction of the composite structure.

Therefore, with the structure, the thermal conductivity in the thickness direction can be increased, and simultaneously, the thermal expansion coefficient in the plane direction can be kept low.

In addition, in the heat sink plate, the cover layers may be formed of copper or a copper alloy, and as a preferred example, the cover layers may be formed of pure Cu having a Cu content of 99 wt % or more.

Furthermore, in the heat sink plate, the alloy layer may be formed of a Cu—Mo alloy. The Cu—Mo alloy may include 30 to 60 wt % of Cu and 40 to 70 wt % of Mo as a preferred example. This is because that when the Cu content is less than 30 wt %, the thermal expansion coefficient becomes too small to be $7 \times 10^{-6}$/K or less, thereby bending occurs in the ceramic direction when the heat sink plate is brazed to the ceramic, and when the Cu content exceeds 60 wt %, the thermal expansion coefficient becomes too high to be $9 \times 10^{-6}$/K or more, thereby bending occurs in the opposite direction of the ceramic when the heat sink plate is brazed to the ceramic. Also, when the Mo content is less than 40 wt %, the thermal expansion coefficient becomes too high to be $9 \times 10^{-6}$/K or more, thereby bending occurs in the opposite direction of the ceramic when the heat sink plate is brazed to the ceramic, and when the Mo content exceeds 70 wt %, the thermal expansion coefficient becomes too small to be $7 \times 10^{-6}$/K or less, thereby bending occurs in the ceramic direction when the heat sink plate brazed to the ceramic.

When the thickness of the cover layers in the thickness direction of the heat sink plate is less than 5% of the total thickness, the thermal expansion coefficient may be too low to cause bending or falling in the heat dissipation property, and when the thickness exceeds 40%, the thermal expansion coefficient may be too high to cause bending in the opposite direction of the thickness direction, and therefore it is preferred that the thickness of the cover layer is 5 to 40% and the thickness of the upper and lower layers is practically the same.

EXAMPLES

Figure 2:
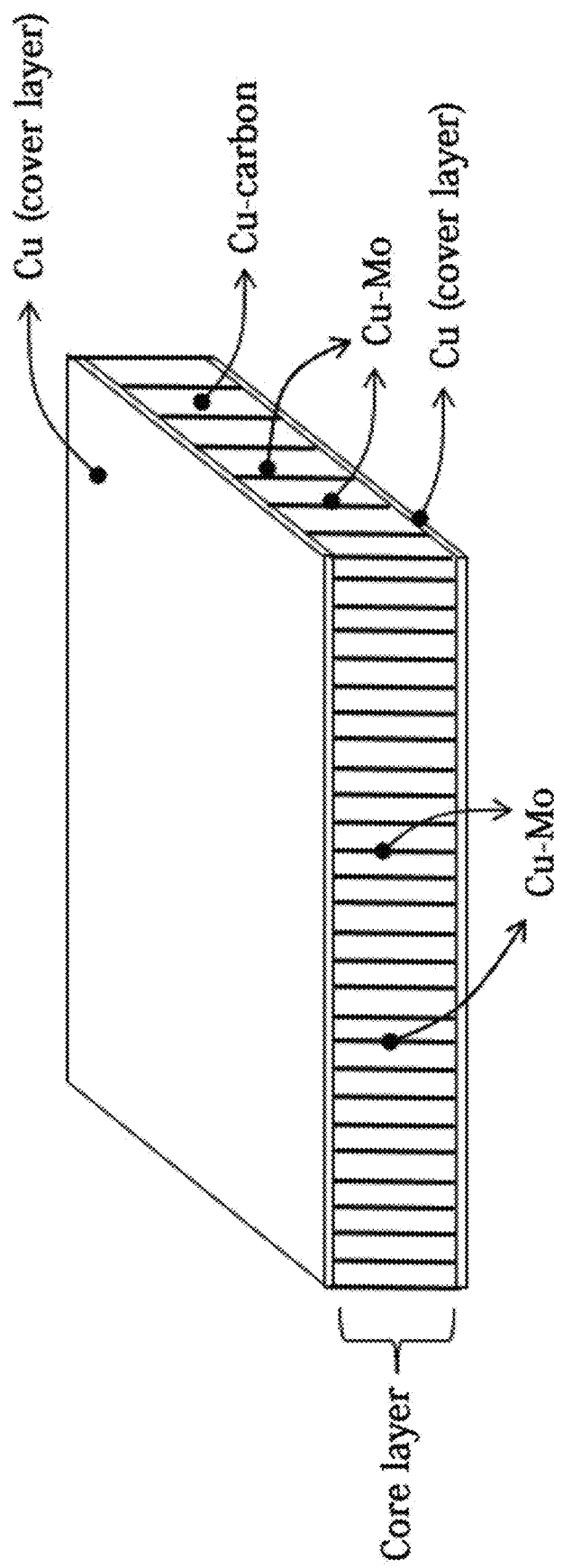
FIG. 2 illustrates an overall structure of a heat sink plate according to a preferred embodiment of the invention.
Figure 3:
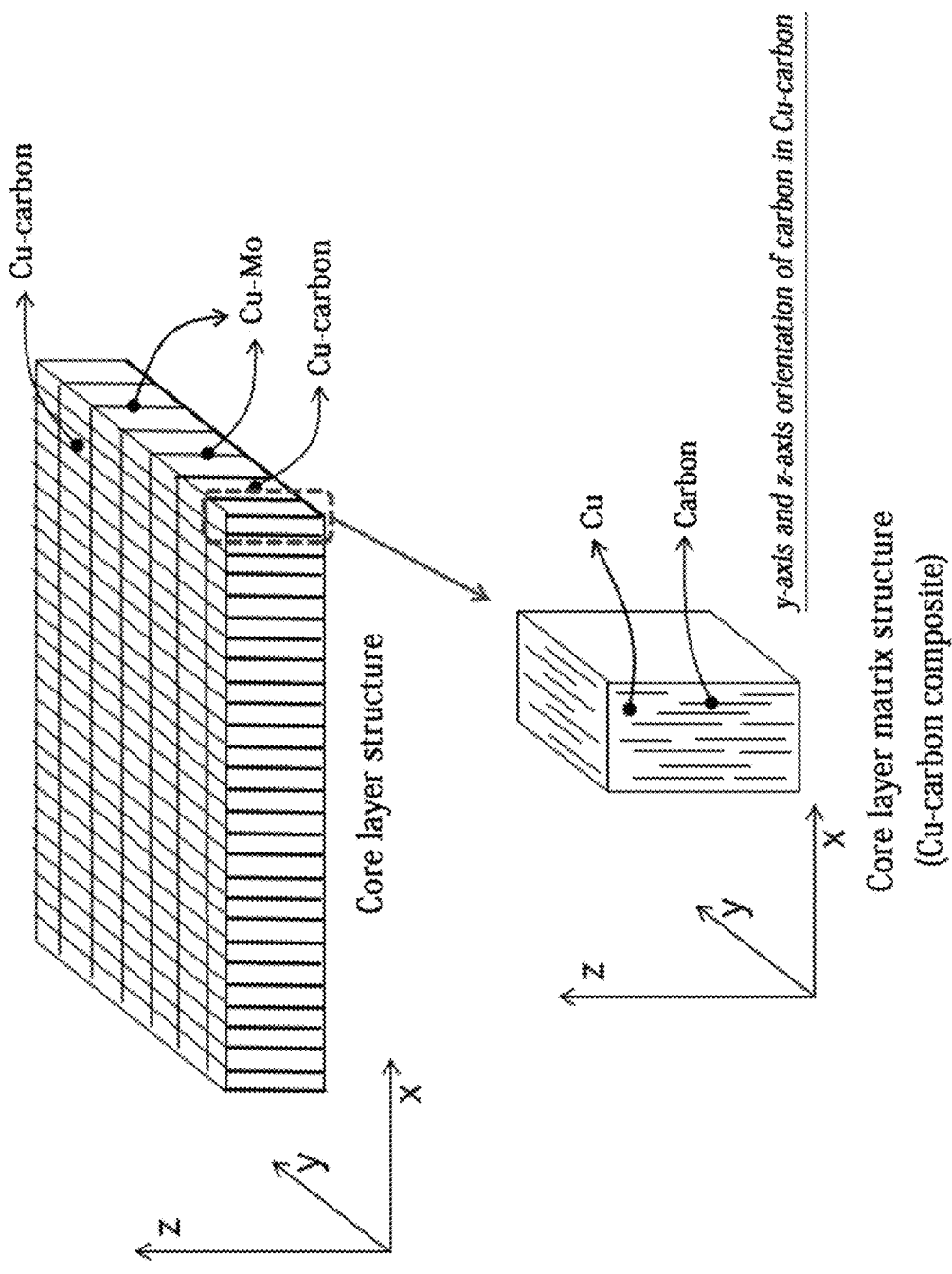
FIG. 3 illustrates a structure of a core layer constituting a heat sink plate according to a preferred embodiment of the invention.

FIG. 2 illustrates the overall structure of a heat sink plate according to a preferred embodiment of the invention, and FIG. 3 illustrates the structure of a core layer constituting a heat sink plate according to a preferred embodiment of the invention.

As illustrated in FIG. 2, according to a preferred embodiment of the invention, the heat sink plate has a structure in which the core layer is disposed in the Cu cover layers.

The core layer, as illustrated in FIG. 3, has a structure in which Cu—Mo alloy layers are arranged in a lattice form in the length direction (x direction) and the width direction (y direction) when viewed from top, wherein the Cu—Mo alloy layers also form the same lattice form when viewed from bottom extending the thickness direction.

The arrangement of the Cu—Mo alloy layers lowers the thermal expansion coefficients in the x and y directions and simultaneously maintains the thermal conductivity in the thickness direction at the maximum. At the same time, when the Cu—Mo alloy layers are bonded to the cover layers formed of Cu, the bonding area to the Cu—Mo alloy layers is minimized, so the arrangement contributes to prevention of delamination between the layers.

In addition, as illustrated in the enlarged view of a lower side of FIG. 3, the unit matrix structure divided by the Cu—Mo lattice and indicated by a dotted line in FIG. 3, is characterized by formed of the composite material of Cu and plate-shaped carbon particles, wherein the plate-shaped carbon particles are oriented roughly parallel to the thickness direction, and also, are oriented parallel to the y direction. Therefore, with the structure, the thermal conductivity in the thickness direction can be maximized, and at the same time, the thermal expansion in the plane direction can be suppressed.

Figure 4:
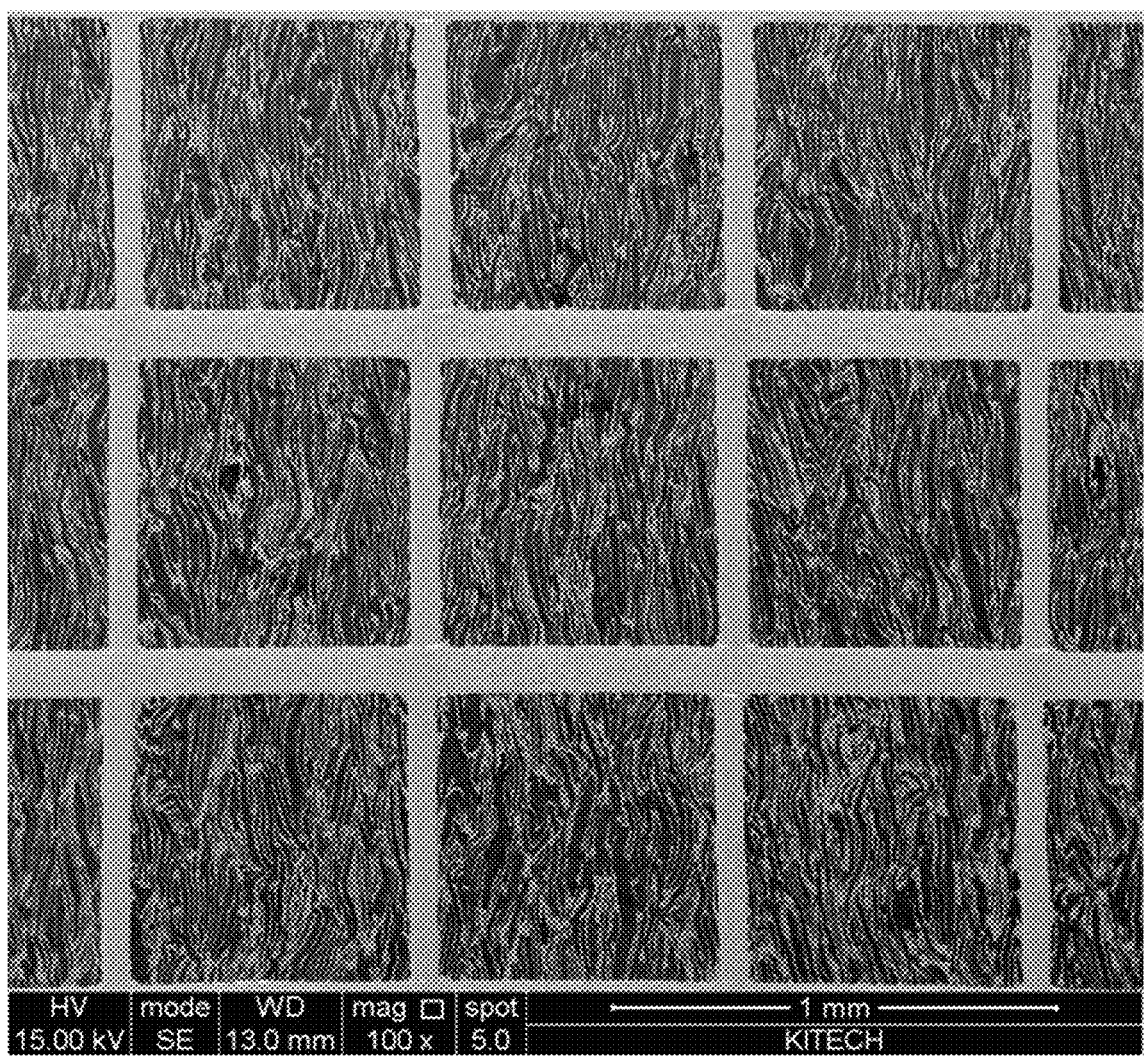
FIG. 4 is a plane image of a core layer constituting a heat sink plate according to a preferred embodiment of the invention.
Figure 5:
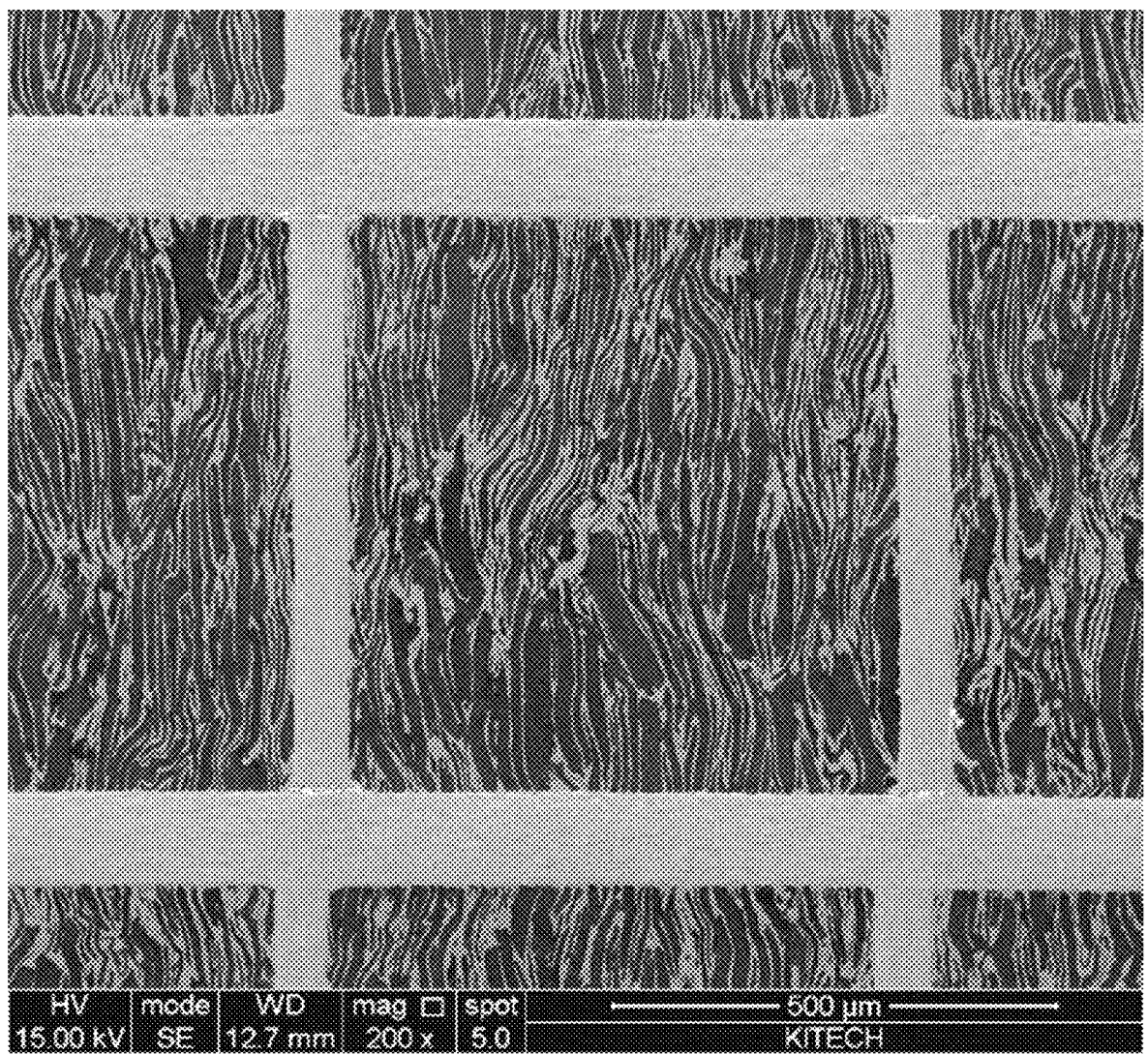
FIG. 5 is an enlarged image of FIG. 4, and shows a state in which carbon particles constituting a composite structure in a lattice composed of Cu—Mo, are oriented in one direction.

FIG. 4 is a plane (top plane) image of the core layer constituting the heat sink plate according to a preferred embodiment of the invention. In FIG. 4, the part in the lattice form of light gray is the Cu—Mo alloy part (Cu: 45 wt %, Mo: 55 wt %), and the part relatively darker is the composite structure part formed of Cu and the scale-shaped carbon particles. As seen in FIG. 5, the carbon particles constituting the composite structure in the Cu—Mo alloy lattice are oriented in one direction of the lattice.

Figure 6:
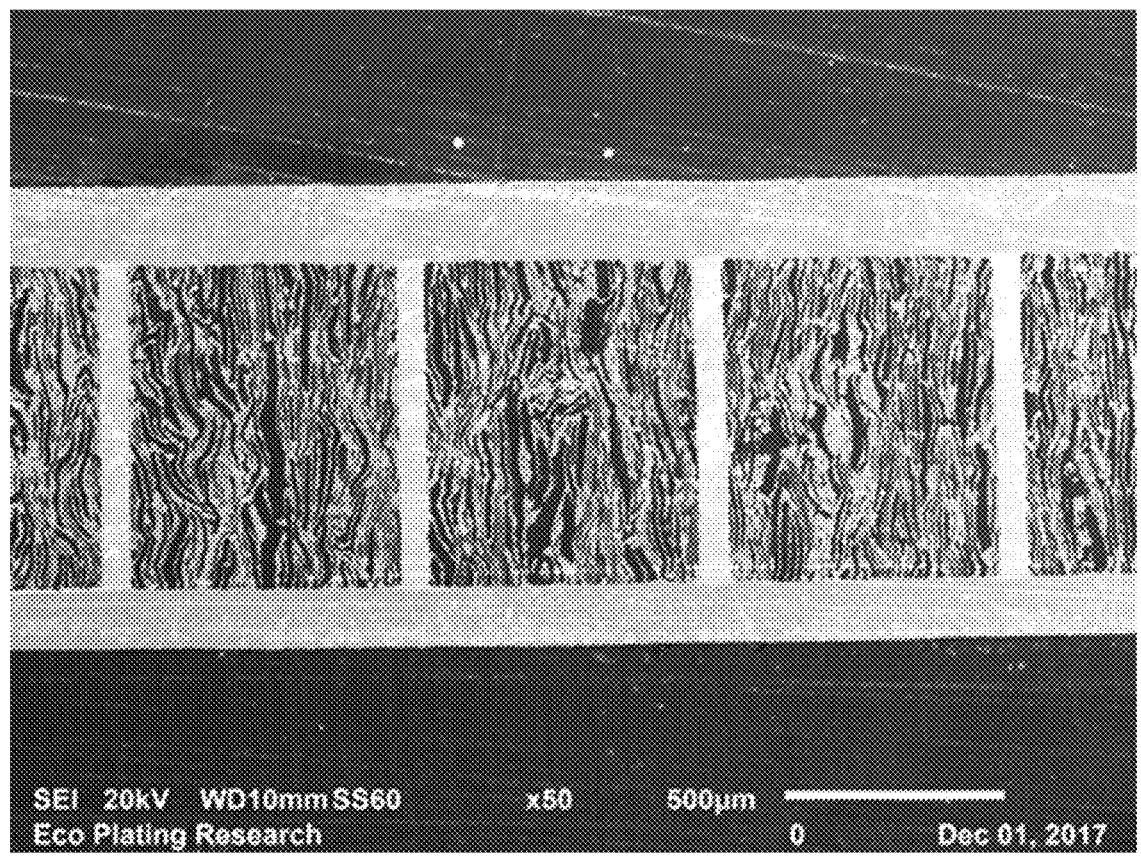
FIG. 6 is a cross-sectional image of the core layer forming the heat sink plate according to the preferred embodiments of the invention.

FIG. 6 is a cross-sectional image of the core layer constituting the heat sink plate according to a preferred embodiment of the invention, and shows a lattice formed of Cu—Mo (the lightest gray) arranged at equal intervals along the thickness direction. Further, the cover layers, formed of Cu, are shown on the upper and lower surfaces of the core layer.

Figure 7:
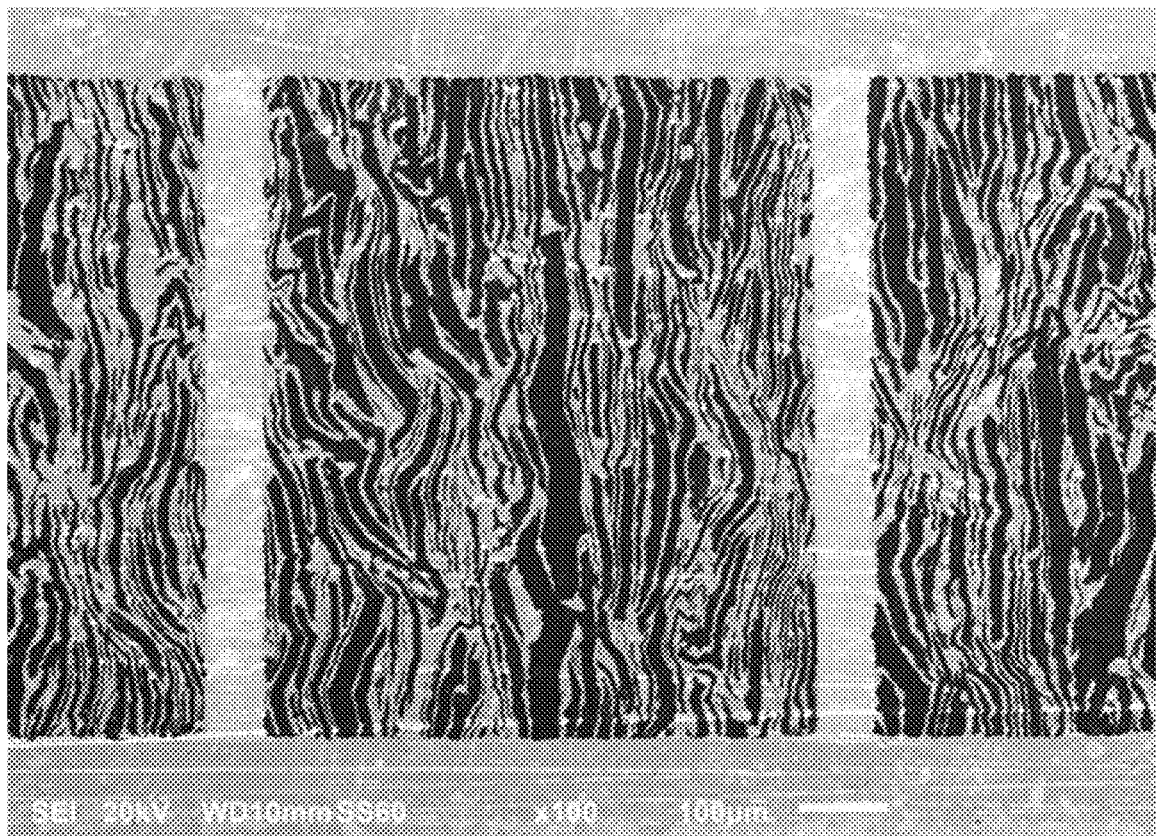
FIG. 7 is an enlarged image of FIG. 6, and shows a state in which carbon particles constituting a composite structure in a lattice composed of Cu—Mo, are oriented in the thickness direction.

FIG. 7, that is an enlarged image of FIG. 6, shows that the carbon particles constituting the composite structure in the lattice formed of Cu—Mo are oriented in the thickness direction.

Figure 8:
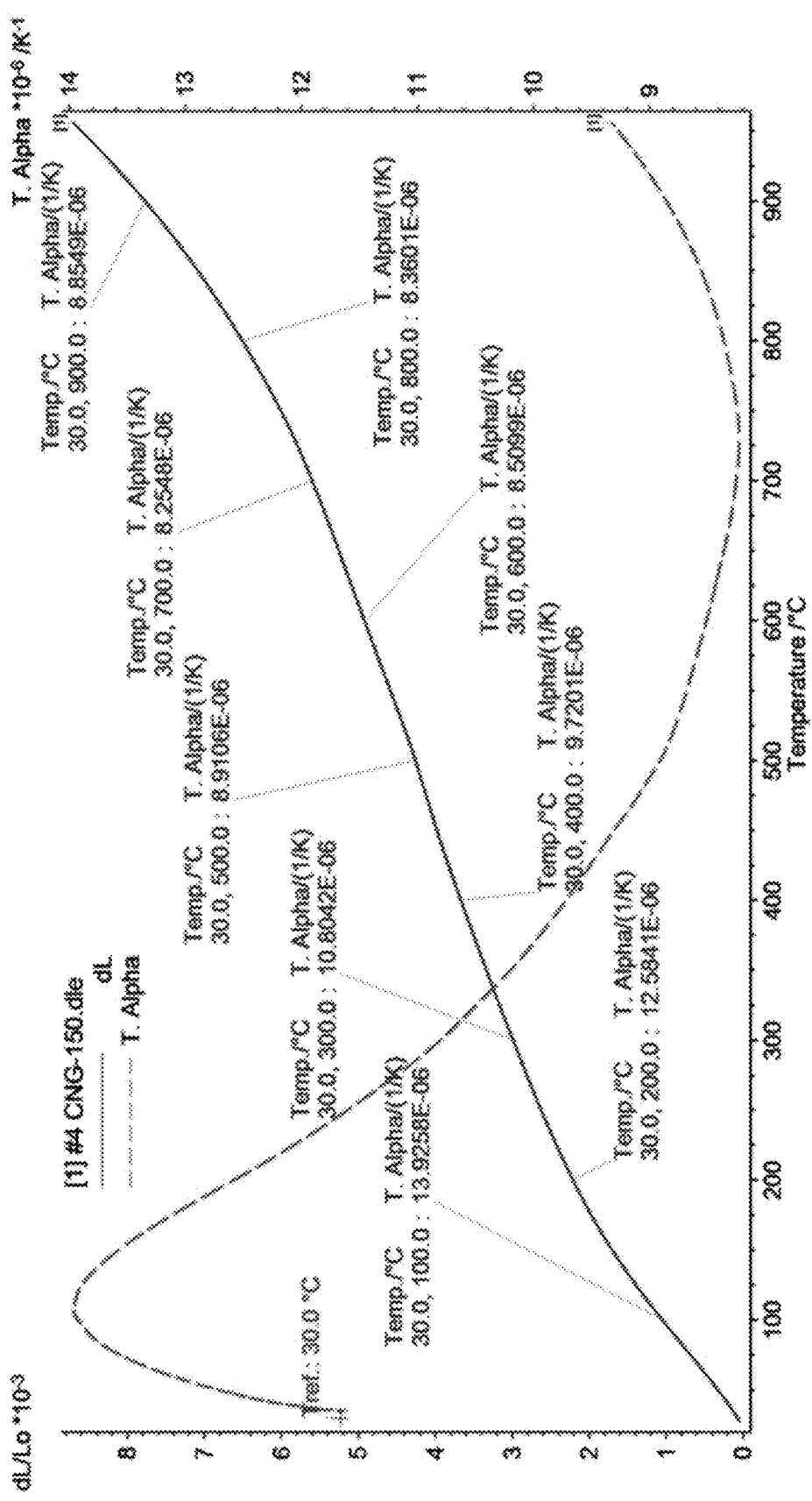
FIG. 8 shows measurement results of thermal expansion coefficient in the transverse direction of a heat sink plate according to a preferred embodiment of the invention.
Figure 9:
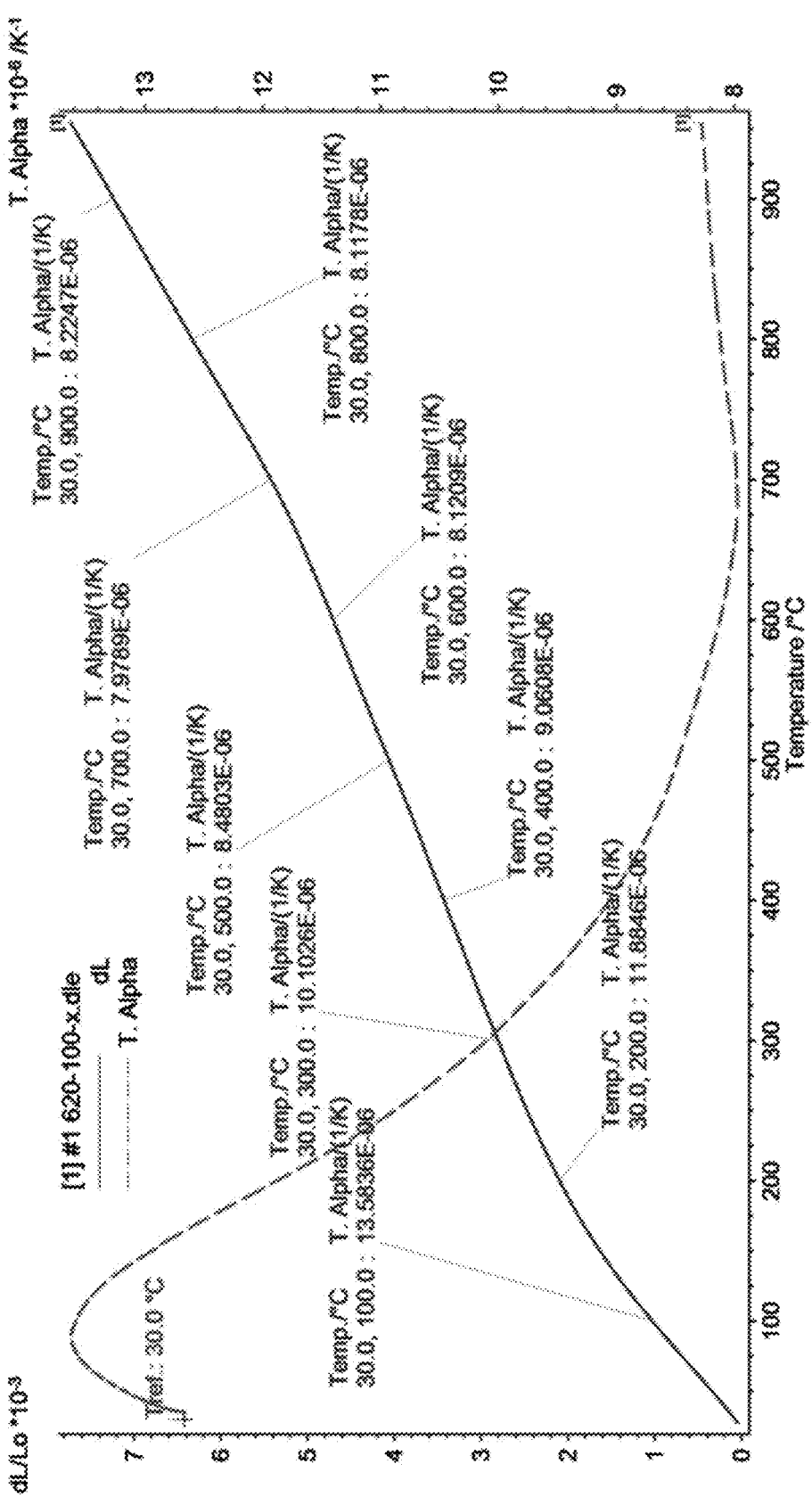
FIG. 9 shows measurement results of thermal expansion coefficient in the longitudinal direction of a heat sink plate according to a preferred embodiment of the invention.

FIG. 8, FIG. 9, and Table. 1 show measured values of the thermal conductivities and thermal expansion coefficients, so as to compare the heat sink plate according to the preferred embodiment of the invention, Comparative Example 1 (having the structure of Cu/Cu—Mo alloy/Cu, and the length ratio in the thickness direction formed of Cu 40%, Cu—Mo 20% and Cu 40%, and also, the total thickness which is the same as the example of the invention), and Comparative Example 2 (formed of pure copper having the same size as the heat sink plate according to the invention).

TABLE 1

| Classification | Thermal conductivity in thickness direction (W/mK) | Thermal expansion coefficient at 800° C. in length (x) direction ($\times 10^{-6}$/K) | Thermal expansion coefficient at 800° C. in width (y) direction ($\times 10^{-6}$/K) |
| --- | --- | --- | --- |
| Example | 400.4 | 8.11 | 8.36 |
| Comparative Ex. 1 | 300 | 11.5 | 12.0 |
| Comparative Ex. 2 (Copper plate) | 380 | 17 | 17 |

As seen in Table. 1, the thermal expansion coefficients of the heat sink plate, according to the example of the invention, are $8.1 \times 10^{-6}$/K to $8.8 \times 10^{-6}$/K, and therefore, since there are almost no differences in thermal expansion coefficients from the ceramic material constituting the high-output semiconductor devices, bending or delamination does not occur when two or more devices are mounted.

In addition, the thermal conductivity of the heat sink plate in the thickness direction, according to the example of the invention, is about 400 W/mK, which is not only superior to the plate of Comparative Example 1 but to the plate formed of only copper (Comparative Example 2), and has remarkably improved thermal conductivity as compared with any heat sink plate capable of achieving the thermal expansion coefficient of $9 \times 10^{-6}$/K or less in the plane direction.

What is claimed is:

1. A heat sink plate having a structure in which two or more kinds of materials are laminated, comprising:
   a core layer in the thickness direction of the heat sink plate; and
   cover layers covering a top surface and a bottom surface of the core layer;
   wherein the cover layers comprise a material containing copper,
   wherein the core layer is formed of a matrix having a first thermal expansion coefficient and a plurality of layers extending in parallel along the thickness direction of the core layer in a lattice form in the matrix,
   wherein the plurality of layers are made of an alloy having a second thermal expansion coefficient.

2. The heat sink plate according to claim 1,
   Wherein the matrix has a composite structure of a material containing copper and carbon, and the plurality of layers are made of alloy layer containing Cu, Mo or Cu and Mo.

3. The heat sink plate according to claim 2,
   wherein the composite structure comprises copper and plate-shaped carbon particles, the plate-shaped carbon particles are oriented parallel to the thickness direction of the heat sink plate, and at the same time, the plate-shaped carbon particles are oriented parallel to one direction of plane directions which are perpendicular to the thickness direction of the heat sink plate.

4. The heat sink plate according to claim 1,
   wherein the cover layers comprise copper or a copper alloy.

5. The heat sink plate according to claim 2,
   wherein the alloy layer comprises a Cu—Mo alloy.

6. The heat sink plate according to claim 5,
   wherein the alloy layer comprises 30 to 60 wt % of Cu, and 40 to 70 wt % of Mo.

7. The heat sink plate according to claim 1,
   wherein the heat sink plate has a thermal conductivity of 350 W/mK or more in the thickness direction of the plate, and thermal expansion coefficients of $8.0 \times 10^{-6}$/K to $9.0 \times 10^{-6}$/K in the length and width directions of the plate.

8. The heat sink plate according to claim 1,
   wherein, in the thickness direction of the heat sink plate, the thickness of the cover layers is 5 to 40% of the total thickness.

* * * * *